United States Patent Office 3,512,975
Patented May 19, 1970

3,512,975

PROCESS FOR THE PREPARATION OF POSITIVE COPIES AND MATERIAL FOR PERFORMING THE PROCESS

Johannes Munder, Roland Moraw, and Ernst-August Hackmann, Wiesbaden-Biebrich, Germany, assignors to Kalle Aktiengesellschaft, Wiesbaden-Biebrich, Germany, a corporation of Germany No Drawing. Filed Dec. 27, 1965, Ser. No. 516,709
Claims priority, application Germany, Dec. 30, 1964, K 54,908
Int. Cl. G03c *5/24, 1/52*
U.S. Cl. 96—48 12 Claims

ABSTRACT OF THE DISCLOSURE

This invention relates to a light-sensitive reproduction material, and to a process for the production of a positive copy using the material, the material comprising a hydrophilic support and a light-sensitive layer thereon, the latter comprising at least one vinyl compound, at least one organic halogen compound which splits off halogen when exposed to light, and at least one polymerization inhibiting agent.

The present invention relates to a process for the preparation of positive copies and a reproduction material for performing the process.

It is known to prepare copies from originals by imagewise exposure of a reproduction material in which the light-sensitive layer consists of a vinyl compound and an organic halogen compound, eg. N-vinyl carbazole and tetrabromomethane, and development of the latent image by a brief heat treatment. In this process, a dye is formed in the exposed areas, so that a negative copy of the master used is obtained.

This known process also has been modified to enable the preparation of positive copies. For this purpose, the material was first imagewise exposed under an original to short-wave ultraviolet radiation in the spectral range from 2200 A. to 2500 A. and then again exposed without the original, to long-wave ultraviolet radiation in the spectral range above 2650 A.; the latent image formed was developed by the action of heat. As a result of the heating process, the image areas not affected by the short-wave ultraviolet radiation turn brown to black so that a positive copy of the original is obtained. In the two foregoing processes, the development by heat action simultaneously effects fixation, provided readily volatile halogenated hydrocarbons are used.

However, the positive process described above has not gained practical acceptance because even the non-image areas of the originals commonly used are not sufficiently translucent in the spectral range of 2200 to 2500 A.

Further, investigations have shown that the light-sensitive layers of the reproduction materials used for the above processes contain only small amounts of monomeric vinyl compounds once they are prepared, since most of the vinyl compounds present have spontaneously polymerized.

The present invention provides a process for the preparation of positive copies which requires no second exposure to ultraviolet light and no development of the latent image by means of heat. The invention also provides a reproduction material for use in performing the process of the invention.

It has been found that monomeric vinyl compounds, e.g. N-vinyl carbazoles, polymerize when they are exposed to light in the presence of halogenated hydrocarbons and that the original capacity of the layer to be wetted with water disappears as a result of the polymerization.

In the process of the present invention, a light-sensitive material, which contains in its light-sensitive hydrophilic layer at least one organic alogen compound which splits off halogen when exposed and at least one component which is polymerizable when exposed and forms a hydrophobic polymer, is exposed under an original and then contacted with an aqueous solution containing one or several dyestuffs. The aqueous dyestuff solution wets only the unexposed areas in which the light sensitive layer is still hydrophilic, so that a positive image of the original is obtained.

The light-sensitive reproduction material used for performing the process of the invention consists of a support and a light-sensitive hydrophilic layer. In the light-sensitive material, the light-sensitive hydrophilic layer contains at least one component which is polymerizable when exposed, at last one organic halogen compound which splits off halogen when exposed, and at least one polymerization inhibiting agent, and, in addition, binders and pigments, if desired. As components which are polymerizable when exposed, there may be used according to the invention two groups of vinyl compounds.

The first group (Group A) comprises such compounds which by themselves form highly light-sensitive layers, with halogenated hydrocarbons, on hydrophilic supports, without requiring an after-treatment. The second group (Group B) comprises such vinyl compounds which by themselves form, with halogenated hydrocarbons, layers which are much less sensitive or even insensitive to light of a wave length from 3500 to 4000 A., but considerably increase the light sensitivity when added to layers containing compounds of Group A.

Group A includes, generally, vinyl compounds in which the vinyl group is linked directly to an aromatic or quasi-aromatic system which may be condensed. Exemplary of such compounds are: styrene, particularly 4-hydroxy-styrene, 4-methoxy-styrene and 4-dimethylamino-styrene; vinyl naphthalenes including acenaphthylene, vinyl pyrene, vinyl anthracene and vinyl phenantrene; C-vinyl-quinolines and C-vinylisoquinolines; N-vinyl acridone, and N-vinyl-thioacridone. N-vinyl carbaxoles of the general formula:

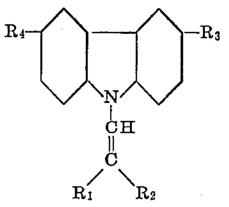

wherein $R_1$, $R_2$, $R_3$ and $R_4$ are the same or different and may be hydrogen or a hydrocarbon residue with 1 to 6 carbon atoms, are particularly suitable. Further examples of suitable N-vinyl carbazoles are: $\omega,\omega$-dimethyl-N-vinyl carbazole and 3,6-dimethyl-N-vinyl carbazole. It is noteworthy that mixtures of the compounds of Group A in most cases cause an increase in light-sensitivity as compared with individual compounds.

Group B includes N-vinyl compounds in which the vinyl group replaces an acid hydrogen attached to a nitrogen atom, for example, in carboxylic acid amides and sulfonic acid amides, viz: N-vinyl acetanilide, N-vinyl ethyl acetamide, N-vinyl phthalic imide, N-vinyl-succinic imide, N-vinyl pyrrolidone, N-vinyl caprolactam, N-vinyl-methane sulfonamide, N-vinyl benzene sulfonamide, N-vinyl naphthole-sulfonamide, N-vinyl-N-ethyl - benzene sulfonamide, N-vinyl-N-methyl-naphthol sulfonamide, N-vinyl-N-phenyl - methane - sulfnamide, and N-vinyl imidazole, further $\alpha$-$\beta$-unsaturated acids and their derivatives, e.g., carboxylic acids, sulfonic acids, phosphonic acids and the esters and amides of these acids; further vinyl ethers, e.g. isobutyl vinyl ether, further dienes, e.g. dimehyl butadiene and cyclohexadiene, further vinyl halides, e.g. vinyl-2-chloroethylether. Of the esters and amides of acrylic and methacrylic acid the following are exemplary: acrylic acid- N,N-diethylamide, acrylic - acid-dimethylester, methacrylic acid methyl ester and methacrylic acid-N,N-diethylamide.

In exceptional cases, compounds of Group B may be used by themselves for the purposes of the invention, provided the latent images are briefly heated to 80–120° C. during exposure or between exposure and application of the dyestuff. Suitable compounds for this purpose are, e.g., N-vinyl acetanilide, N-vinyl capolactam, and N-vinyl pyrrolidone.

As halogenated hydrocarbons which split off halogen when exposed, one or more compounds of the general formula:

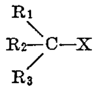

may be used, wherein X may be chlorine, bromine or iodine, and $R_1$, $R_2$ and $R_3$ may be chlorine, bromine, iodine, hydrogen or alkyl (which latter may, if desired, be substituted by chlorine, bromine or iodine) or aryl, aralkyl, alkenyl or a heterocyclic group, the groups being if desired, also substituted by alkyl or preferably halogen. $R_1$, $R_2$ and $R_3$ may be the same or different.

The radicals $R_1$, $R_2$ and $R_3$, when taken together also may form part of a heterocyclic quasi-aromatic ring. Among the group of compounds falling under this general definition, the following are particularly suitable: pentabromoethane, tetrabromoethane, and ω,ω,ω-tribromoacetophenone, which may carry in the aromatic ring one or more substituents selected from the group consisting of halogen, alkoxy, alkyl, nitro, carboxylic acid and sulfonic acid groups; tetrabromopyrrol and tetraiodopyrrol; tetraiodothiophene and tetrabromothiophene; hexachloroethane, tetraiodomethane, and iodoform.

For rendering the latent images visible, aqueous solutions of dyestuffs are used as developers. The quantity and kind of the dyestuffs used are not critical since the images may be rendered visible by means of any ink or other aqueous dyestuff solution. Dyestuffs which are directly absorbed by the cellulose fiber or the pigment particles and binders present have proved to be particularly advantageous. The following table is a list of dyestuffs which have proved to be particularly suitable:

| | |
|---|---|
| | Schultz' Farbstofftabellen, vol. I, 1931 |
| Crystal Violet B | 785 |
| Brilliant Green H | 760 |
| Eosin A | 881 |
| Erythrosin | 886 |
| Malachite Green | 754 |
| Naphthol Green | 5 |
| Nile Blue BX | 1029 |
| Patent Blue | 826 |
| Rhodamine B | 864 |
| Rhoduline Blue 6G | 755 |
| Safranine T | 967 |
| Methylene Blue B | 1038 |
| Hansa Yellow G | 84 |
| | Schultz' Farbstofftabellen, II. Supplement, 1939 |
| Zapone Fast Blue 3B | 280 |
| Zapone Fast Red GE | 280 |
| Zapone Fast Black M | 280 |

In cases where the non-image areas also tend to accept some color, it is advantageous to add an antiwetting agent, e.g. silicone oils, or an antifoaming agent. Further, it is advantageous to use in such cases a dyestuff which exhibits an indicator effect, i.e. is colorless or only slightly yellow colored in an acid medium but shows a strong color, e.g. blue or red, in the neutral or basic range. For this purpose, the effect is utilized that hydrohalic acids are liberated in the non-image areas during the reaction according to the invention, so that, in addition to the physical differentiation due to the polymerization process, a differentiation is also caused in the pH-values of the image and non-image areas. To improve this effect, the pH-value of the light-sensitive layer may be shifted to higher values by adding alkaline reacting substances, such as sodium carbonate, potassium carbonate, alkali phosphates, alkali silicates, alkali borates or such organic bases as are added to the light-sensitive layer in any event as inhibitors, e.g. dimethylnaphthalene or quinoline. Alternatively, the precoats or the solution used for preparing the light-sensitive layer may comprise alkaline reacting resins, such as, e.g., a condensate of formaldehyde with dimethyl aniline, N-phenyl piperazine or casein, basic melamine resins, and the like. The following are suitable dyestuffs showing an indicator effect useful for the development of the material: tetrabromophenol sulfophthalein, dibromocresol-sulfophthalein, dichlorophenol sulfophthalein, dibromothymol sulfophthalein, thymol sulfophthalein, o-cresol-phthalein and phenol-phthalein.

It is of advantage in these cases to render the developer solutions slightly alkaline, the preferred pH values being from 8 to 11, so that the indicator dyestuffs are more easily soluble. It does not matter if small quantities of the dyestuff solution penetrate also into the non-image areas of the layer, because they are immediately neutralized by the excess acid present in these areas and thus become colorless. These indicator dyestuffs are used with particularly good results in the case of layers containing vinyl carbazole derivatives, because with such layers particularly large quantities of acid are formed during exposure.

Depending on the kind of vinyl compound used, an appropriate quantity of polymerization inhibitor must be added to the solution prepared for the production of the light-sensitive layer, so that a premature polymerization of the vinyl compound used is avoided. The inhibiting effect of the substance added must, however, not be such that polymerization during exposure is prevented. The amount of inhibitor may vary within wide limits. Generally, it will be sufficient to add 0.0001 to 3%, based on the weight of the coating composition. Preferably, 0.001 to 1% is added to the coating composition. In exceptional cases it may be advantageous to add amounts of up to 10% of inhibitor.

The following compounds have proved advantageous as polymerization inhibitors for the purposes of the invention: organic amino compounds, such as triethanol amine, diisopropyl amine, triisopropyl amine, dimethyl aniline, pyridine, and quinoline; aromatic hydroxyl compounds, such as phenol, hydroquinone, pyrocatechol, pyrogallol, and dihydro resorcinol; organic acids, such as acetic acid, propionic acid, pyroracemic acid, malonic acid, oxalic acid, fumaric acid, maleic acid, and benzoic acid; sulfur compounds, such as thiophenol, thiophenol sulfonic acids and thiophenol carboxylic acids, 3-mercaptobenzthiazole, cystine, cysteine; ferrocene and its substiacid, oxalic acid, fumaric acid, maleic acid, and benzoic none, particularly if they are substituted in the 2-position by OH-groups, and amino carboxylic acids, such as glycocoll, alanine and phenyl alanine.

The contrast of the images and the freedom from background may be further improved by selecting a suitable support. For instance, a base paper commonly used for photocopying or a normal writing paper may be used, which was impregnated before the application of the light-sensitive layer by coating it was a surface-active, finely dispersed substance capable of being wetted with water in a suitable binder, the surface active substance absorbing the monomeric vinyl compound without losing its hydrophilic properties. Surfaces of this kind lose their hydrophilic properties upon polymerization during exposure, presumably because the pigment particles are covered by the hydrophobic polymers. Furthermore, transparent plastic films, which are either hydrophilic per se or have been rendered hydrophilic by coating with a hydrophilic intermediate layer, e.g. films of regenerated cellulose or polyester films coated with hardened polyvinyl alcohol, may be used as suitable supporting materials, pigments being added, if desired, to the hydrophilic coating composition for polyester films. A specific film support which has been found to be advantageous is a transparent, multiaxially stretched, dimensionally stable polyester film having a hydrophilic surface.

Precoats of this type consist of pigment substances, e.g. finely ground sulfates of alkaline earth metals, dispersed silica, powdered silicates, such as, e.g., kaolin, undissolved starch, preferably rice or oats starch, or finely ground aluminum oxide, magnesium oxide or titanium dioxide. These pigments are applied to the support, advantageously while dispersed in a binder, the kind and quantity of binder being selected so that the hydrophilic properties of the pigment are maintained. Binders of this type are: polyvinyl acetate, casein, soaked starch, carboxy methyl cellulose, hardened polyvinyl alcohol, hydroxy methyl cellulose, carboxy methyl amylose and several copolymers of acrylic acid, e.g., with vinyl chloride, styrene and other vinyl compounds. Further, polyglycide ethers of polyfunctional phenols are also suitable.

Alternatively, the paper support may be impregnated with a water-soluble or at least hydrophilic synthetic substance which at least substantially prevents the penetration of the organic sensitizing solution into the paper mass. Impregnation with these hydrophilic substances may take place either during the paper manufacture on a so-called gluing appliance in the paper making machine, or by subsequent application in a suitable coating machine. It is also possible to apply the layers to the paper surface in the form of a lacquer.

The following substances have proved suitable: polyvinyl alcohol which may be hardened by formaldehyde or by heating in the paper mass to such a degree that it becomes insoluble but retains its hydrophilic properties; polyvinyl acetate in which no more than ⅓ of the OH-groups of the basic polyvinyl alcohol must be esterified; polyvinyl pyrrolidone, if desired in the form of a copolymer with other vinyl compounds; polyacrylic acid and hydrophilic copolymers of polyacrylic acid with other vinyl compounds, such as styrene, maleic anhydride and dimethylbutadiene. Cellulose ethers and esters, carboxymethyl cellulose, carboxy methyl amylose, hydroxy alkyl cellulose, hydrolyzed or partially hydrolyzed copolymers of maleic anhydride and styrene, soluble starch and the decomposition products thereof, such as dextrine, and mixtures of the above-mentioned substances are also suitable.

Images with particularly good contrast are obtained when the composition containing the light sensitive substances is applied to the surface of the support together with film-forming resins which are soluble in organic solvents. This is of particular advantage when the vinyl compounds or the halogenated hydrocarbons used have a pronounced crystallizing tendency. Film-forming resins which are particularly suitable for this purpose are: polyvinyl acetates, such as those marketed under the name "Mowilith," alkyd resins, maleic acid copolymers, copolymers of acrylic acid and methacrylic acid or of esters and amides with styrene and other vinyl compounds, melamine resins, phenolformaldehyde condensates and cresol-formaldehyde condensates, dimerized abietic acid, and fatty alcohol polyglycolethers. In principle, all resins may be used for this purpose which are capable of forming a film. They must, however, be applied only in such quantities that the hydrophilic properties of the surface of the pretreated support are not destroyed. For coating the materials according to the invention, the components of the layer are applied from a solution in an organic solvent, e.g., acetone, trichloroethylene, tetrachloroethylene, chloroform, methylenechloride, methylethyl ketone, benzene, toluene or chlorobenzene.

The invention will be further illustrated by the following specific examples:

EXAMPLE 1

A photocopying base paper commonly used in photocopying is precoated with a precoat consisting of "Syloid" (a colloidal silicic acid supplied by Davison Chemical Company, Baltimore, U.S.A.), "Aerosil" (a colloidal silicic acid supplied by Degussa, Frankfurt, Germany), and casein, in water, and dried. The paper is then soaked in a sensitizing solution consisting 10 parts by weight of N-vinyl carbazole, 5 parts of weight of carbon tetrabromide, and 0.03 part by weight of pyridine in 100 parts by weight of acetone. After evaporation of the solvent, the material is exposed for 2 minutes through a transparent positive original to a 160-watt mercury-tungsten mixed light lamp at a distance of 30 cm. When the exposed coating is wetted with a solution of 0.25 part by weight of Brilliant Green in 100 parts by volume of water, a high-contrast, green positive image of the original is obtained. Excess dye is removed by pressing the image against filter paper or washing it with water.

The following dyes also can be used with equally good results to yield images of the colors noted:

Crystal Violet B—Blue image
Erythrosine—Red image
Malachite Green—Green image
Nile Blue BX—Blue image
Rhodamine B—Violet-red image

EXAMPLE 2

A photocopying base paper is precoated superficially with a dispersion consisting of 3 parts by weight of "Aerosil" (a colloidal silicic acid supplied by Degussa, Frankfurt, Germany) and 2.5 parts by weight of "Mowilith D12 (a polyvinyl acetate dispersion supplied by Farbwerke Hoechst A.G., Frankfurt-Höchst, Germany) in 100 parts by weight of water. The paper is then sensitized with a solution consisting of 20 parts by weight of N-vinyl acetanilide, 10 parts by weight of carbon tetrabromide and 0.01 part by weight of di-isobutylamine in 100 parts by weight of acetone. After drying, the material is exposed for 7 minutes under a transparent positive original to a 160-watt mixed light lamp at a distance of 30 cm. The exposed material is heated to 130° C. for 3 minutes. After wetting with a solution of 0.3 part by weight of Crystal Violet B in 100 parts by volume of water, a positive image of the original is obtained. The image has poorer contrast than that obtained in Example 1.

EXAMPLE 3

A photographic base paper is coated, to a weight of 15 gm./square meter, on one side with an aqueous dispersion of casein and "Acronal" (a copolymeristate of polyacrylic and polymethacrylic ester supplied by BASF, Ludwigshafen, Germany) in the proportion of 2:1. The reverse side of the paper is coated with a water-repellent coating of a cellulose triacetate, applied from a 20% solution in acetone. After drying this coating, a solution of 10 g. of N-vinyl carbazole, 5 g. of 2,5-dimethyl-$\omega,\omega,\omega$-tribromoacetophenone, and 0.02 g. of 2-mercaptobenzothiazole in 100 ml. of benzene is applied and dried. The material is exposed for 2 minutes through a transparent original to a 160-watt mixed light lamp, and the resulting latent image is developed by treatment with a solution of 0.25 g. of Crystal Violet B in 100 ml. of water. A positive image of the original is obtained which is dark blue in color and almost free from background.

EXAMPLE 4

A precoated paper, as described in Example 1, is coated with a solution of 10 parts by weight of N-vinyl carbazole, 5 parts by weight of hexachloroethane, 3 parts by weight of "Alftalat 420 A" (an alkyd resin supplied by Chemische Werke Albert, Wiesbaden-Biebrich, Germany) and 0.05 part by weight of quinoline in 100 parts by weight of methylene chloride and exposed for 3 minutes through a transparent original to a 1000-watt mixed light lamp. It is then developed by treatment with a solution of 0.2 part by weight of dibromothymolsulfophthalein in 100 ml. of water having a pH of 8. A blue image of the original is obtained which is practically free from background.

EXAMPLE 5

A precoated paper as described in Example 3 is coated with a solution in acetone of 10 parts by weight of N-vinyl carbazole, 5 parts by weight of tetraiodopyrrole, and 0.01 part by weight of hydroquinone. After exposure for 2 minutes to a 160-watt mixed light lamp through a transparent original, the latent image is developed by treatment with a solution of 0.25 part by weight of Crystal Violet B in 100 parts by weight of water. A blue image of the original is obtained.

EXAMPLE 6

A precoated paper, as described in Example 1, is coated with a solution of 2 g. of polyvinyl alcohol in 100 ml. of water, and dried. A sensitizing solution of 8 g. of N-vinyl carbazole, 2 g. of N-vinyl-pyrrolidone, 5 g. of carbon tetrabromide, 3 g. of "Mowilith CT5" (a polyvinyl acetate supplied by Farbwerke Hoechst A.G., Frankfurt-Höchst, Germany) and 0.05 g. of triethanol amine in 100 g. of toluene is then applied. After drying the material is exposed through a transparent original for 2 minutes to a 160-watt mixed light lamp. Development is effected with a solution of 0.25 g. of Malachite Green and 0.02 g. of a silicone oil in 100 ml. of water. A green image of the original is obtained which is free from background.

EXAMPLE 7

A standard photographic base paper is precoated with an aqueous dispersion which contains (in 100 parts by weight of water) 3 parts by weight of "Mowilith D12" (a polyvinyl acetate supplied by Farbwerke Hoechst A.G., Frankfurt-Höchst, Germany), 2 parts by weight of rice starch and 2 parts by weight of "Aerosil" (a colloidal silicic acid supplied by Degussa, Frankfurt, Germany), and dried. The material is sensitized with a solution consisting of 5 parts by weight of pentabromoethane, 8 parts by weight of N-vinyl carbazole, 3 parts by weight of dimethyl butadiene and 0.1 part by weight of pyrridine in 100 parts by weight of acetone. The material is exposed for 2 minutes through a transparent positive original to a 160-watt mixed light lamp and a pale yellow negative image of the original is obtained. When development is then effected with a 0.25% by weight aqueous solution of Crystal Violet, a positive, high-contrast, blue image of the original is obtained, the yellowish background in the non-image areas being compensated by small amounts of dye adsorbed in these areas.

EXAMPLE 8

A precoated photographic base paper, as described in Example 1, is coated with a sensitizing solution consisting of 3 g. of "Mowilith CT5" (a polyvinyl acetate supplied by Farbwerke Hoechst A.G., Frankfurt-Höchst, Germany), 5 parts by weight of carbon tetrabromide, 0.01 part by weight of mercaptobenzothiazole, 0.01 part by weight of ferrocene, 10 parts by weight of N-vinyl carbazole, and 13 parts by weight of N-vinyl succinimide in 100 parts by weight of trichloroethylene. After exposure through a transparent original to a 160-watt mixed light lamp for 2 minutes, development is effected as described in Example 1. Instead of N-vinyl succinimide, the same amount by weight of isobutylvinyl ether, dimethylacrylic acid methyl ester, acrylic acid-N,N-dimethylamide, styrene, N-vinylacetanilide, N-vinyl caprolactam, cinnamic acid or acenaphthylene can be used with equally good results. In the case of acenaphthylene, a slightly yellow background is obtained. This coating also can be exposed under an ordinary 250-watt tungsten lamp for 8 minutes with good results.

EXAMPLE 9

A precoated photographic base paper as described in Example 1 is coated with a sensitizing solution consisting of 5 g. of N-ω,ω-dimethylvinyl carbazole, 5 g. of N-vinyl pyrrolidone, 5 g. of carbon tetrabromide and 0.03 g. of quinoline in 100 g. of methylene chloride, exposed imagewise for 3 minutes to a 160-watt mixed light lamp and developed by treatment with a solution of 0.25 g. of Rhodamine B in 100 ml. of water. A violet-red image is obtained.

EXAMPLE 10

A precoated photographic base paper, as described in Example 1, is coated with a sensitizing solution consisting of 20 g. of styrene, 10 g. of carbon tetrabromide, 0.05 g. of pyridine, and 3 g. of "Mowilith CT5" (a polyvinyl acetate supplied by Farbwerke Hoechst A. G., Frankfurt-Höchst, Germany) in 100 g. of acetone, and exposed for 5 minutes to a 1000-watt mixed light lamp through a transparent original. After dyeing with a solution of 0.25 g. of Crystal Violet B and 0.01 g. of Span emulsifier in 100 g. of water, a blue image of the original is obtained.

EXAMPLE 11

A precoated photographic base paper, as described in Example 1, is coated with a sensitizing solution consisting of 10 g. of styrene, 5 g. of acenaphthylene, 6 g. of "Mowilith CT5" (a polyvinyl acetate supplied by Farbwerke Hoechst A. G., Frankfurt-Höchst, Germany), 5 g. of dimethyl-ω,ω,ω-tribromoacetophenone, and 0.05 g. of triethanolamine in 100 g. of trichloroethylene and exposed imagewise for 7 minutes to a 1000-watt mixed light lamp. The material is developed by treatment with a solution of 0.25 g. of Crystal Violet B in 100 ml. of water. A positive high-contrast image of the original is obtained, the yellowish background in the non-image areas, which is visible after exposure, being compensated by small amounts of the dye absorbed in these areas.

EXAMPLE 12

A superficially saponified acetate film is coated with a solution consisting of 10 parts by weight of N-vinyl carbazole and 10 parts by weight of N-vinyl pyrrolidone in 100 parts by volume of acetone and dried. The coated foil is then briefly exposed to the action of gaseous carbon tetrabromide. It is then exposed for three minutes under a transparent positive original to the light of an 18 amp. arc lamp at a distance of 60 cm. When the exposed layer is wetted with a solution of 0.5 part by weight of Crystal Violet in 100 parts by volume of water, a blue positive image of the original is obtained which is rich in contrast. For removal of excess dyestuff, the image may be pressed on filter paper or washed with water.

An image of equivalent quality is obtained if the support mentioned above is replaced by a polyester film hardened by means of polyvinyl alcohol.

It will be obvious to those skilled in the art that many modifications may be made within the scope of the present invention without departing from the spirit thereof, and the invention includes all such modifications.

What is claimed is:

1. A process for the production of a positive copy which comprises exposing a light-sensitive layer on a hydrophilic support to light under a master and treating the exposed layer with an aqueous solution of at least one dyestuff, the light-sensitive layer comprising at least one vinyl compound which is photopolymerizable in the presence of halogen, at least one organic halogen compound which splits-off halogen when exposed to light, and at least one polymerization inhibiting agent.

2. A process according to claim 1 in which the polymerization inhibiting agent is selected from the group consisting of organic amino compounds, aromatic hydroxyl compounds, organic acids, sulfur compounds, ferrocene and substitution products thereof, benzoin, benzil, benzophenone, and amino carboxylic acids.

3. A process according to claim 1 in which the light-sensitive layer is applied to a hydrophilic layer comprising an inorganic compound disposed in a binder material, the inorganic compound being finely divided and selected from the group consisting of sulfates of alkaline earth metals, silica, silicates, starch, aluminum oxide, magnesium oxide, and titanium dioxide.

4. A process according to claim 1 in which the vinyl group of the vinyl compound is directly linked to an aromatic system.

5. A process according to claim 1 in which the vinyl compound is selected from the group consisting of styrene, acenaphthylene, and vinyl anthracene.

6. A process according to claim 1 in which the vinyl compound has the formula:

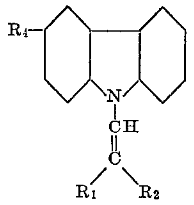

in which $R_1$, $R_2$, $R_3$, and $R_4$ are selected from the group consisting of hydrogen and alkyl groups having 1 to 6 carbon atoms.

7. A process according to claim 1 in which the vinyl compound comprises a mixture of at least one vinyl compound in which the vinyl group is linked to an aromatic system, and at least one vinyl compound in which the vinyl group replaces an acid hydrogen atom.

8. A process according to claim 1 in which the halogen compound has the formula:

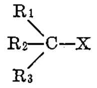

in which X is selected from the group consisting of chlorine, bromine, and iodine, and $R_1$, $R_2$, and $R_3$ are selected from the group consisting of chlorine, bromine, iodine, hydrogen, alkyl, aryl, aralkyl, alkenyl, and heterocyclic groups.

9. A process according to claim 1 in which the halogen compound is selected from the group consisting of tetrabromomethane, 4-bromo - ω,ω,ω - tribromoacetophenone, 2,4-dimethyl--ω,ω,ω-tribromoacetophenone, and 3-nitro-ω,ω,ω-tribromoacetophenone.

10. A process according to claim 1 in which the halogen compound is a polyhalogenated, quasiaromatic, heterocyclic, five-membered ring compound.

11. A process according to claim 1 in which the support is paper having a hydrophilic surface.

12. A process according to claim 1 in which the support is a transparent, multi-axially stretched, dimensionally stable polyester film having a hydrophilic surface.

References Cited

UNITED STATES PATENTS

| | | | |
|---|---|---|---|
| 3,042,517 | 7/1962 | Wainer | 96—90 |
| 3,042,518 | 7/1962 | Wainer | 96—90 |
| 3,042,519 | 7/1962 | Wainer | 96—90 |
| 3,060,024 | 10/1962 | Burg et al. | |
| 3,202,507 | 8/1965 | Sprague et al. | 96—90 |
| 3,359,105 | 12/1967 | Wainer | 96—90 |

NORMAN G. TORCHIN, Primary Examiner

R. E. FICHTER, Assistant Examiner

U.S. Cl. X.R.

96—90

PO-1050
(5/69)

UNITED STATES PATENT OFFICE
CERTIFICATE OF CORRECTION

Patent No. 3,512,975 Dated May 19, 1970

Inventor(s) Johannes Munder, Roland Moraw and Ernst-August Hackmann

It is certified that error appears in the above-identified patent and that said Letters Patent are hereby corrected as shown below:

Column 1, line 34, "eg." should read --- e. g. ---.

Column 2, line 5, "alogen" should read --- halogen --- . Line 43, "carbaxoles" should read --- carbazoles ---. Line 71, "sulfnamide" should read --- sulfonamide ---.

Column 3, line 15, "capolactam" should read --- caprolactam ---.

Column 4, lines 60 and 61, "acid, oxalic acid, fumaric acid, maleic acid, and benzoic none," should be deleted and replaced by --- tution products; further benzoin, benzil, and benzophenone, ---. Line 69, "was" should read --- with ---.

Column 6, line 57, "copolymeristate" should read --- copolymerisate ---.

Column 9, the right hand portion of the formula of Claim 6, should read:

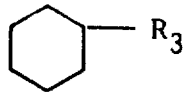

Signed and sealed this 15th day of September 1970

(SEAL)
Attest:

EDWARD M.FLETCHER,JR.
Attesting Officer

WILLIAM E. SCHUYLER, JR.
Commissioner of Patents